United States Patent [19]

Proebsting

[11] 3,832,576

[45] Aug. 27, 1974

[54] ENCODER CIRCUIT TO REDUCE PIN COUNT FOR DATA ENTRY INTO INSULATED GATE FIELD EFFECT TRANSISTOR INTEGRATED CIRCUITS

[75] Inventor: Robert J. Proebsting, Richardson, Tex.

[73] Assignee: Texas Instruments Incorporated, Dallas, Tex.

[22] Filed: June 7, 1972

[21] Appl. No.: 260,644

Related U.S. Application Data

[63] Continuation of Ser. No. 65,839, Aug. 21, 1970, abandoned.

[52] U.S. Cl. .................. 307/209, 307/244, 307/304, 307/251, 307/279

[51] Int. Cl. .................. H01l 27/02

[58] Field of Search ........... 307/305, 307, 209, 236, 307/251, 279, 304, 244; 317/235 G; 328/118

[56] References Cited

UNITED STATES PATENTS

| | | | |
|---|---|---|---|
| 3,165,584 | 1/1965 | Thornton et al. | 328/118 |
| 3,213,294 | 10/1965 | Okuda | 307/209 |
| 3,267,459 | 8/1966 | Chomicki et al. | 307/209 |
| 3,427,445 | 2/1969 | Dailey | 317/235 |
| 3,571,630 | 3/1971 | Widlar | 317/235 |
| 3,618,044 | 11/1971 | Cupp | 307/209 |

*Primary Examiner*—Rudolph V. Rolinec
*Assistant Examiner*—E. Wojciechowicz
*Attorney, Agent, or Firm*—Harold Levine; Rene E. Grossman; Stephen S. Sadacca

[57] ABSTRACT

An insulated gate field effect transistor compatible encoder circuit employs a field effect transistor and a lateral bipolar transistor to reduce the number of transmission lines or pins necessary to transmit information to an insulated gate field effect transistor integrated circuit employing such encoder circuit as its input. The input to the encoder circuit is coupled to both the gate of a field effect transistor and the emitter of a bipolar transistor. When a negative voltage is transmitted to the input, the field effect transistor turns on; when a positive voltage is transmitted to the input, the bipolar transistor is turned on; and when no voltage is transmitted to the input, neither transistor is turned on. The outputs of the transistors are then gated to provide three distinct logic inputs, from the single input, for the insulated gate field effect transistor integrated circuit.

10 Claims, 5 Drawing Figures

PATENTED AUG 27 1974

3,832,576

SHEET 1 OF 2

Figures 1, 2, 3, 4:
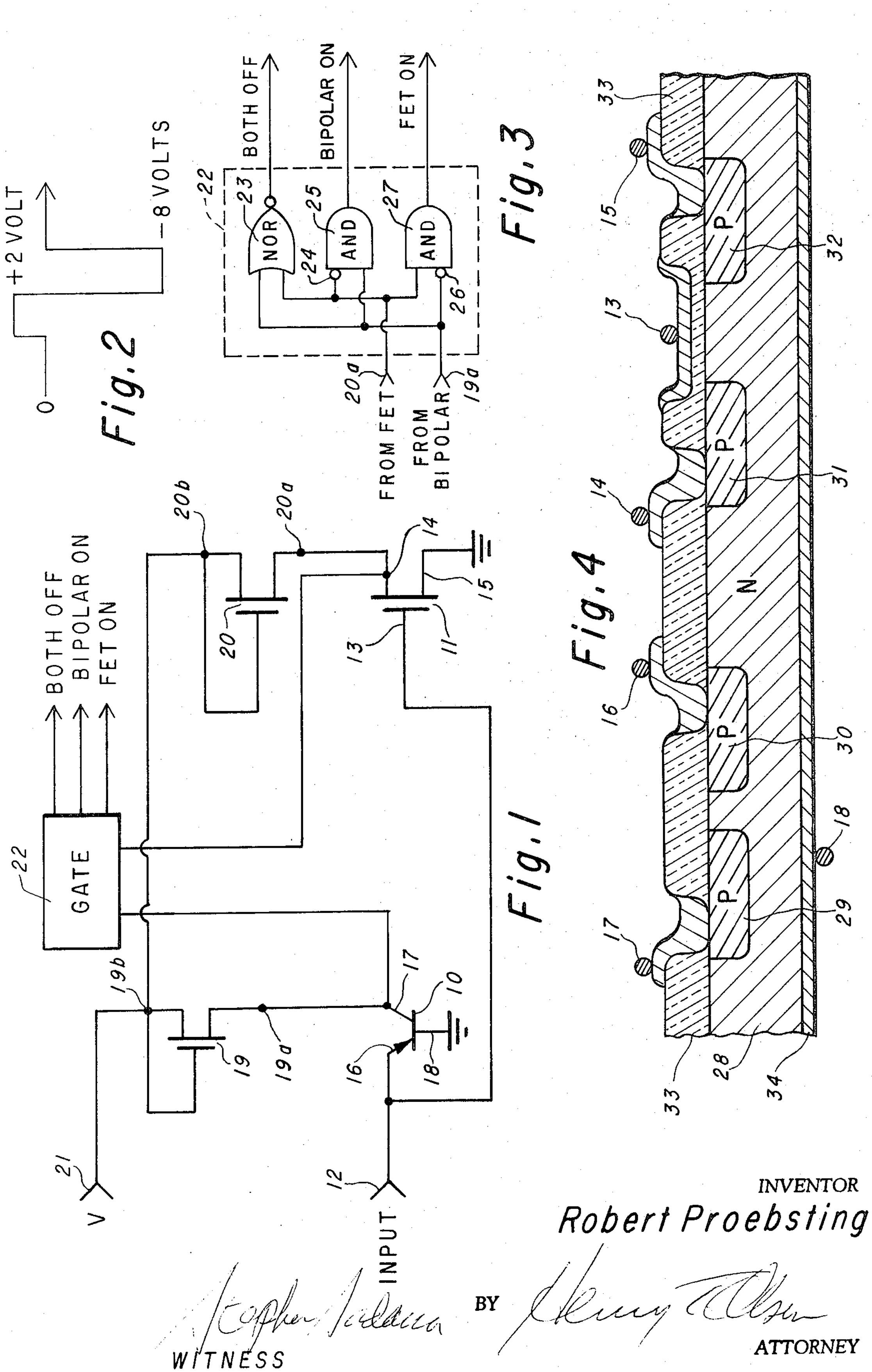

INVENTOR
Robert Proebsting

WITNESS

BY

ATTORNEY

ENCODER CIRCUIT TO REDUCE PIN COUNT FOR DATA ENTRY INTO INSULATED GATE FIELD EFFECT TRANSISTOR INTEGRATED CIRCUITS

This is a continuation, of application Ser. No. 065,839, filed Aug. 21, 1970 and now abandoned.

This invention relates to encoder circuits and more particularly to an insulated gate field effect transistor compatible encoder circuit for reducing the number of transmission lines or pins necessary to transmit information to an integrated circuit employing such encoder circuit as its input.

In the integrated circuit art, it is highly desirable to build an entire microminiature circuit on a single semiconductor substrate. One factor which greatly limits the building of such a circuit is the number of transmission lines or pins which must be provided to interconnect the microminiature integrated circuit with exterior circuitry. Typically, the size of the package required to support a semiconductor substrate and the necessary electrically conductive pins which protrude through such package to allow interconnection of the integrated circuit outside of the package is many times the size of the semiconductor substrate itself. This is particularly true in the fabrication of integrated circuits employing insulated gate field effect transistors, as the geometry requirements for such circuits is even less than that required for bipolar transistor circuits, for example, which means that even more circuitry can be fabricated on a semiconductor substrate of equal size. An encoder circuit, which is capable of reducing the number of pins necessary for information entry into an integrated circuit, is needed.

In addition, the reduction of the number of transmission lines required to transmit data from outside circuitry into integrated circuits and in particular, insulated gate field effect transistor integrated circuits is of as much importance as the reduction of the number of pins required for interconnection of a single integrated circuit to extend electrical circuitry. In the computer industry, for example, it is necessary to transmit digital information from a keyboard terminal to other peripheral equipment such as tape or card punching apparatus, temporary or permanent data storage buffers or central processors. If the data is transmitted from the keyboard in binary form, n transmission lines are required for the transmission of $2^n$ independent logic conditions. Utilizing the encoder circuit of the present invention, $3^n$ independent logic conditions may be transmitted over n transmission lines, thereby reducing the total number of transmission lines required to run between the keyboard, etc., and other peripheral equipment considerably.

It is therefore an object of the present invention to provide an encoder circuit which may be integrated in combination with another circuit to reduce the number of pins required for data entry into such other circuit.

Another object of the invention is to provide an encoder circuit to reduce the pin count for data entry into insulated gate field effect transistor integrated circuits.

A further object of the invention is to provide an encoder circuit which combines field effect transistor logic with bipolar transistor logic to reduce the number of transmission lines or pins necessary to transmit information to another circuit employing such encoder circuit as its input.

Still another object of the invention is to provide inexpensive encoder means for reducing the number of output connections from one digital system such as keyboard to another digital system such as a computer.

It is yet a further object of the invention to provide means for encoding decoded data transmitted over n transmission lines into $3^n$ independent logic conditions.

These and other objects and advantages are accomplished in accordance with the present invention by providing an insulated gate field effect transistor compatible encoder circuit which employs a field effect transistor and a bipolar transistor to reduce the number of transmission lines necessary to transmit information to another circuit employing such encoder as its input. The input to the encoder is coupled to both the gate of a field effect transistor and the emitter of a bipolar transistor. When a positive voltage is transmitted to the input, the bipolar transistor is turned on; when a negative voltage is transmitted to the input, the field effect transistor is turned on; and when no voltage is transmitted to the input, neither transistor is turned on. The outputs of the transistors are then gated to provide three distinct logic inputs, from the single input, for the other circuit. In a preferred embodiment, both the field effect transistor and lateral bipolar transistor are fabricated on a single semiconductor substrate which may include the other circuit for which the encoder is providing a tertiary logic input. Since the encoder circuit is compatible with insulated gate field effect transistor logic, such other circuit may be comprised of field effect transistors.

Still further objects and advantages of the invention will be apparent from the detailed description and claims and from the accompanying drawings wherein:

FIG. 1 illustrates an embodiment of the encoder circuit of the invention;

FIG. 2 illustrates an example of a tri-level voltage signal which is applied to the input of the encoder circuit of FIG. 1 to provide three independent logic conditions for another circuit; and FIG. 3 illustrates a logic circuit which is utilized as the GATE in one embodiment of the invention, FIG. 4 illustrates a portion of semiconductor integrated circuit structure including both the insulated gate field effect transistor and the lateral bipolar transistor of the circuit of FIG. 1 in a single substrate.

Figure 5:
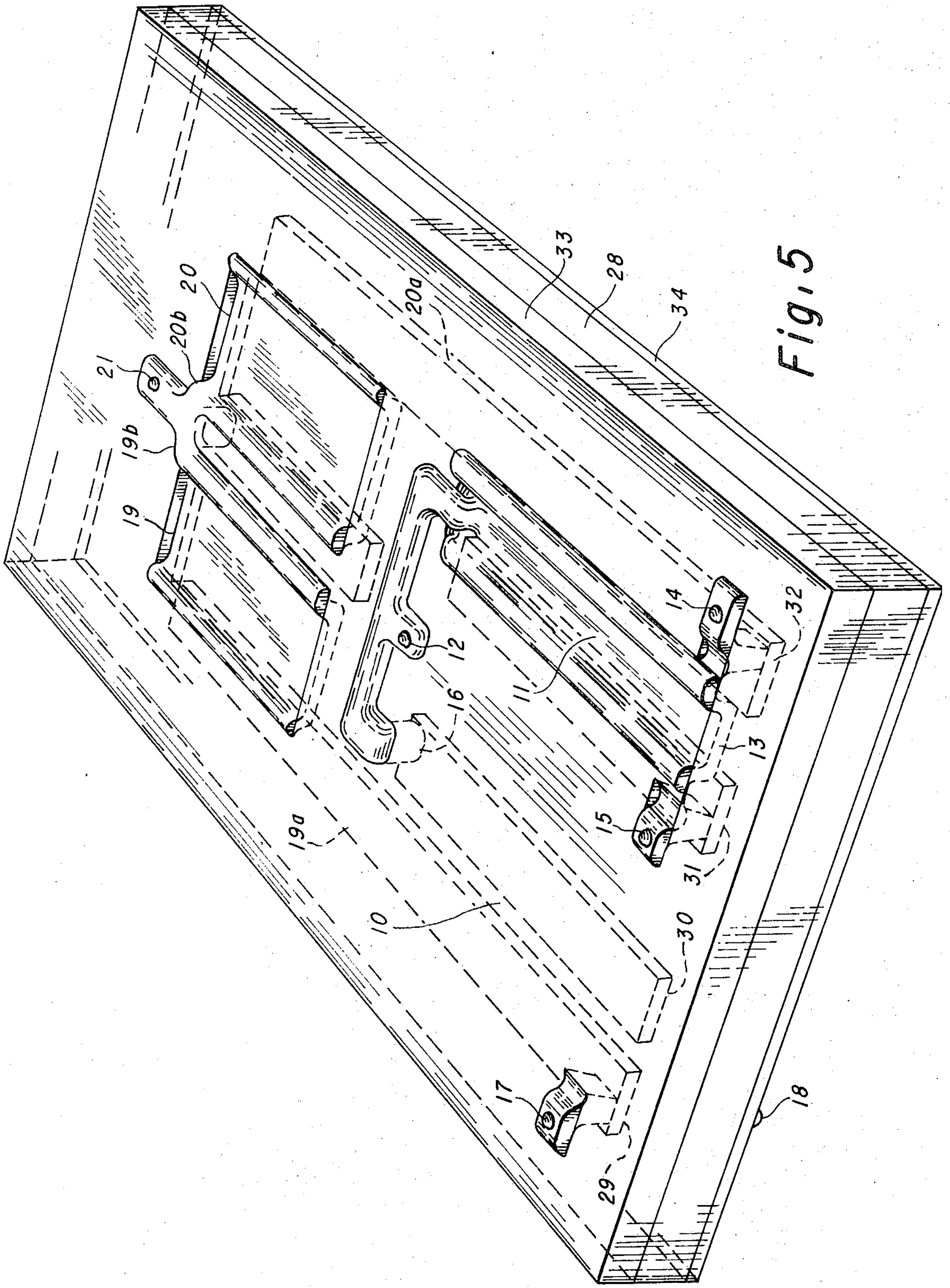

FIG. 5 illustrates the structure of FIG. 4 including resistive means and interconnects.

Referring then to the drawings, and in particular to FIG. 1, the encoder circuit of the invention is essentially comprised of bipolar transistor 10 and insulated gate field effect transistor 11. INPUT terminal 12 of the encoder circuit is coupled to both gate 13 of transistor 11 and emitter 16 of transistor 10. Resistive means are connected between terminals 19*a* and 19*b* and between terminals 20*a* and 20*b* for the collector 17 of transistor 10 and drain 14 of transistor 11, respectively. to provide load resistance for the transistors. In the illustrated embodiment, gate-shorted-to-drain transistors 19 and 20 provide the necessary load resistance for the circuit and are easily fabricated in conjunction with transistors 10 and 11 as will henceforth be described in detail. The base 18 of transistor 10 and the source 15 of transistor 11 are both connected to ground. The applied voltage at V terminal 21 is a negative voltage for a circuit employing a P channel field effect transistor and PNP bipolar transistor ranging, for example, from −10 to −25 volts.

Then, when a negative voltage is transmitted to INPUT terminal 12, field effect transistor 11 turns on; when a positive voltage is transmitted to INPUT terminal 12, bipolar transistor 10 turns on; and when no voltage (0 volts) is transmitted to INPUT terminal 12, neither transistor is turned on. An example of a tri-level voltage signal utilized as an input signal to operate the encoder circuit to provide 3 independent logic conditions is illustrated in FIG. 2. At 0 voltage level both transistors are off, +2 volts to the emitter of the bipolar starts conduction providing an output therefrom or −8 volts to the gate of the field effect transistor starts conduction from source to drain providing an output signal from that transistor.

Referring again to FIG. 1, the output of bipolar transistor 10 at collector terminal 17 and the output of field effect transistor 11 at drain terminal 14 are then gated in logic GATE 22 to provide the three independent logic conditions for other circuits employing the encoder circuit as its input. One embodiment of a logic GATE circuit which may be utilized in conjunction with the encoder circuit is illustrated in FIG. 3. The output signals from terminals 17 and 14 are applied to NOR gate 23 to provide a logic 1 output on the BOTH OFF line when both transistors are off. The output from the field effect transistor at drain terminal 14 is complemented in NOT gate 24 and then applied to AND gate 25 along with the output from the bipolar transistor at collector terminal 17 to provide a logic 1 output on the BIPOLAR ON line when the bipolar transistor is turned-on and the output from the bipolar transistor at collector terminal 17 is complemented in NOT gate 26 and then applied to AND gate 27 along with the output from the field effect transistor at drain terminal 14 to provide a logic 1 on the FET ON line when the field effect transistor is turned on. In a preferred embodiment, GATE circuit 22 utilizes field effect transistor logic and may therefore be simultaneously fabricated on a single substrate along with the rest of the encoder circuit.

A particular advantage of the encoder circuit described with respect to FIG. 1 lies in the fact that bipolar transistor 10, field effect transistor 11 and field effect resistors 19 and 20 are capable of being simultaneously fabricated in a single semiconductor substrate with only one diffusion step. The fabrication of an embodiment utilizing this advantage will now be described with reference to FIGS. 4 and 5. As indicated above, the GATE circuit may also be fabricated simultaneously in the same substrate with the same single diffusion step where field effect logic is employed. As field effect transistor AND, NOT and NOR gates utilized in the GATE circuit are well known in the art, discussion will be limited to The fabrication of the rest of the encoder circuit.

Referring then to FIG. 4, illustrated is a cross-sectional view of the lateral bipolar transistor and field transistor which perform the switching for the encoder circuit. The encoder circuit is fabricated by starting with a monocrystalline semiconductor substrate 28 of one conductivity type (N, for example). Regions 29, 30, 31 and 32 of opposite conductivity type (P, respectively) are then diffused into substrate 28. A layer 33 of insulating material, such as oxide or nitride or combinations thereof of the same semiconductor material as substrate 28, is formed over the entire substrate surface including the areas where the diffusions have been made. The insulating layer below gate contacts, such as gate contact 13, acts as the gate insulator for the field effect transistor and is therefore much thinner than the rest of the layer (1,000 A as compared to 5,000 to 20,000 A, for example). Metal such as aluminum is selectively deposited over insulating layer 33 to form gate 13, and over regions 29, 30, 31 and 32 where portions of insulating material have been removed to form terminal 17 for the collector of the bipolar transistor, 16 for the emitter of the bipolar transistor, 14 for the drain of the field effect transistor, 15 for the source of the field effect transistor and the interconnections therebetween. In addition, an adherent metal ground plate 34 is provided as the base contact 18 of the bipolar transistor.

An embodiment of a completed integrated circuit (except for the GATE circuit) is illustrated in FIG. 5. Note in particular that resistive means providing load resistance for transistors 10 and 11 are comprised of gate-shorted-to-drain field effect transistors 19 and 20 respectively. Interconnection between collector terminal 17 and gate-shorted-to-drain field effect transistor 19 at terminal 19*a* and interconnection between drain 14 and gate-shorted-to-drain field effect transistor 20 at terminal 20*a* are provided by diffused tunnels.

Several embodiments of the encoder circuit of the invention have now been described in detail. It is to be noted, however, that these descriptions of specific embodiments are merely illustrative of the principles underlying the inventive concept. It is contemplated that various modifications of the distinct embodiment, as well as other embodiments of the invention, will, without departing from the spirit and scope of the invention, be apparent to persons skilled in the art.

What is claimed is:

1. An encoder circuit for encoding a tri-state input data signal represented by the presence and absence of an input binary signal into three independent logic output voltages comprising:

a. first circuit means operatively responsive only to positive input voltage having a first input terminal for receiving said input voltage, said first circuit means including a bipolar transistor having its emitter connected to said first input terminal for receiving said input voltage and its collector connected to said positive output terminal, b. second circuit means operatively responsive only to negative input voltage having a second input terminal for receiving said input voltage and having a negative output terminal, said second circuit means including a field effect transistor having its gate connected to said second input terminal for receiving said input voltage and its drain connected to said negative output terminal; and c. gating means connected to said output terminals of said first and second circuit means for providing said three output voltages.

2. The encoder circuit of claim 1 further including:

a. first bias means for voltage biasing said collector terminal; and b. second bias means for voltage biasing said drain terminal.

3. The encoder circuit of claim 1 wherein said base terminal and said source terminal are connected to circuit ground.

4. The encoder circuit of claim 2 wherein said bias means are comprised of gate-shorted-to-drain field effect transistors.

5. An encoder circuit for generating a different binary combination of first and second output signals in response to each of three different voltage levels of a tri-level voltage signal applied to its input terminal comprised of:

a. a field effect transistor having source, drain and gate terminals;
b. a bipolar transistor having emitter, collector and base terminals;
c. first conductive means electrically coupling said emitter terminal and said gate terminal to provide said input terminal;
d. second conductive means electrically coupling said base terminal and said source terminal to circuit ground;
e. first means for electrically coupling a base voltage to said collector terminal, said collector terminal providing means for generating said first binary ouput signal; and
f. second means for electrically coupling a bias voltage to said drain terminal, said drain terminal providing means for generating said second binary output signal.

6. The encoder circuit of claim 5 wherein said first and second means are comprised of gate-shorted-to-drain field effect transistors.

7. The encoder circuit of claim 5 including logic means coupled to said collector terminal and said drain terminal for generating three independent logid signals, each of said three independent logic signals corresponding to one of the three different binary combinations of said first and second output signals.

8. An integrated semiconductor encoder circuit for generating a different binary combination of first and second output signals in response to each Of three different voltage levels of a tri-level voltage signal applied to its input terminal comprised of:

a. a monocrystalline semiconductor body having two major surfaces, said body including:
   i. a semiconductor substrate of one conductivity type, and
   ii. at least four regions of opposite conductivity type in said substrate extending to one of said major surfaces;
b. a layer of insulating material adherently formed on said one major surface having thicker and thinner portions, a thinner portion being located between a first and second of said regions of opposite conductivity type and having openings in said thicker portion exposing areas of selected ones of said regions of opposite conductivity type including said first and second regions;
c. an area of adherent metal formed on at least one thinner portion of said insulating layer to provide a gate terminal for a field effect transistor;
d. metal adherently formed within said openings in said layer of insulating material ohmically connected to the exposed areas of said regions of opposite conductivity type to provide source and drain terminals to said first and second regions of opposite conductivity type for said field effect transistor and provide at least two additional terminals to third and fourth regions of opposite conductivity type for a bipolar transistor, said additional terminals being emitter and collector;
e. a layer of metal adherently formed on the other major surface to provide a base terminal for said bipolar transistor;
f. means for electrically connecting said emitter terminal and said gate terminal to provide said input terminal;
g. means coupling said base terminal and said source terminal to circuit ground;
h. first means for coupling a bias voltage to said collector terminal, said collector terminal providing means for generating said first binary output signal; and
i. second means for coupling a bias voltage to said drain terminal, said drain terminal providing means for generating said second binary output signal.

9. The integrated circuit of claim 8 including logic means coupled to said collector terminal and said drain terminal for generating three independent logic signals, each logic signal corresponding to one of the three different combinations of said first and second output signals.

10. The integrated circuit of claim 8 wherein said first and second means are comprised of field effect transistors formed on said semiconductor substrate and having respective source, drain and gate terminals, the gate terminals of each being electrically shorted to their respective drain terminals to provide means for applying said bias voltage and the source terminals of each providing means for connection to the circuit.

* * * * *